United States Patent [19]

Batra

[11] Patent Number: 4,466,172

[45] Date of Patent: Aug. 21, 1984

[54] METHOD FOR FABRICATING MOS DEVICE WITH SELF-ALIGNED CONTACTS

[75] Inventor: Tarsaim L. Batra, Cupertino, Calif.

[73] Assignee: American Microsystems, Inc., Santa Clara, Calif.

[21] Appl. No.: 287,388

[22] Filed: Jul. 27, 1981

Related U.S. Application Data

[63] Continuation-in-part of Ser. No. 001,840, Jan. 8, 1979, abandoned.

[51] Int. Cl.³ .................. H01L 21/283; H01L 21/318; H01L 29/78
[52] U.S. Cl. ..................................... 29/571; 29/576 B; 29/578; 29/589; 29/590; 148/1.5; 148/187; 156/653; 156/657; 156/662; 357/23; 357/41; 357/59
[58] Field of Search ...................... 29/571, 578, 576 B, 29/589, 590; 148/1.5, 187; 156/653, 657, 662; 357/23S, 41, 59

[56] References Cited

U.S. PATENT DOCUMENTS

| | | | |
|---|---|---|---|
| 3,648,125 | 3/1972 | Peltzer | 357/50 |
| 3,913,211 | 10/1975 | Seeds et al. | 29/571 |
| 3,936,858 | 2/1976 | Seeds et al. | 357/23 |
| 3,978,577 | 9/1976 | Bhattacharyya et al. | 29/571 |
| 4,079,504 | 3/1978 | Kosa | 148/187 X |
| 4,103,415 | 8/1978 | Hayes | 29/571 |
| 4,169,270 | 9/1979 | Hayes | 357/23 |
| 4,192,059 | 3/1980 | Khan et al. | 29/571 |
| 4,221,044 | 9/1980 | Godejahn et al. | 29/571 |
| 4,221,045 | 9/1980 | Godejahn | 29/571 |

OTHER PUBLICATIONS

Tanigaki et al., "New Self-Aligned Contact Technology", J. Electrochem. Soc., vol. 125, No. 3, Mar. 1978, pp. 471-472.

*Primary Examiner*—W. G. Saba
*Attorney, Agent, or Firm*—Alan H. MacPherson; Steven F. Caserza

[57] ABSTRACT

A method for fabricating an integrated circuit semiconductor device comprised of an array of MOSFET elements having self-aligned or self-registered connections with conductive interconnect lines. The method involves the formation on a substrate of a thick oxide insulation layer (30) surrounding openings (99) therein for the MOSFET elements. A gate electrode (38) within each opening is utilized to provide self-registered source (42) and drain (44) regions and is covered on all sides and on its top surface with a gate dielectric layer (46). After the formation of the source-drain regions a relatively thin dielectric protective layer (38) is applied to the entire chip prior to the application of an upper insulative layer (50). When oversized windows are etched in the upper insulative layer, the protective layer prevents etching of the gate dielectric layer (46), thus preventing shorts or leaks between conductive and active areas and providing self-aligned contacts with minimum spacing from adjacent conductive areas (40). With the present method, additional internal protection over prior art devices is provided in MOS devices with source-drain regions formed either by diffusion or ion implantation.

12 Claims, 31 Drawing Figures

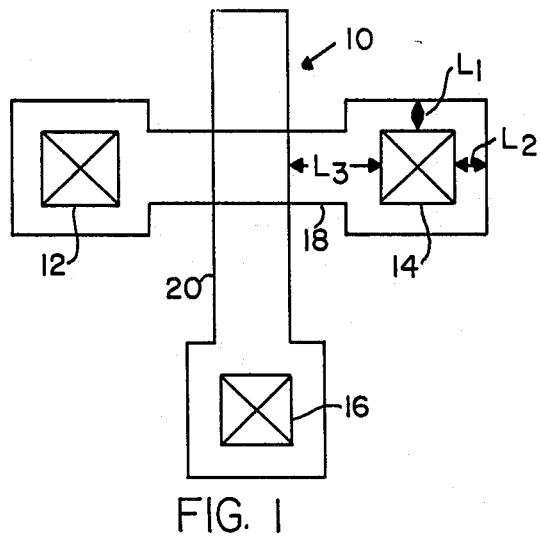
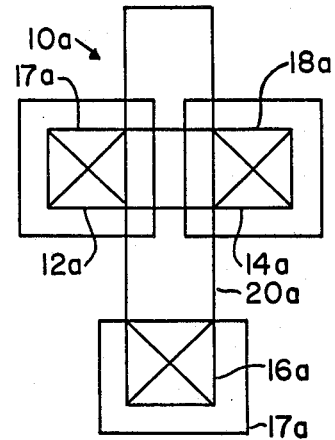
FIG. 1
FIG. 2
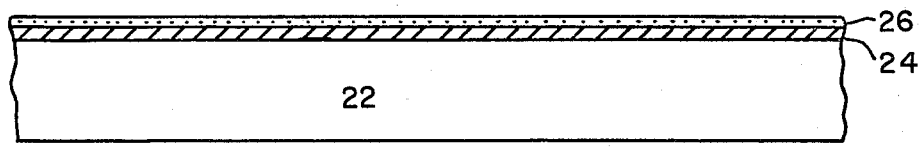
FIG. 3a,b
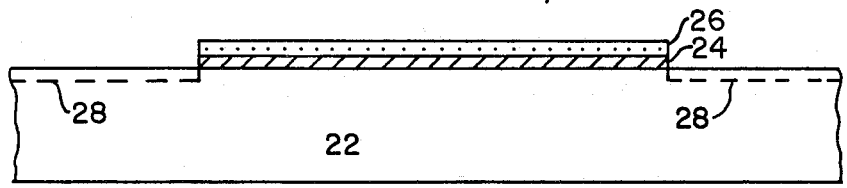
FIG. 4a,b
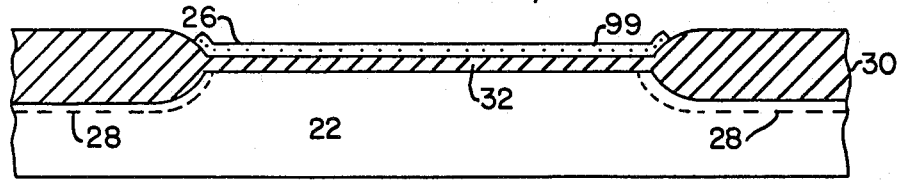
FIG. 5a,b
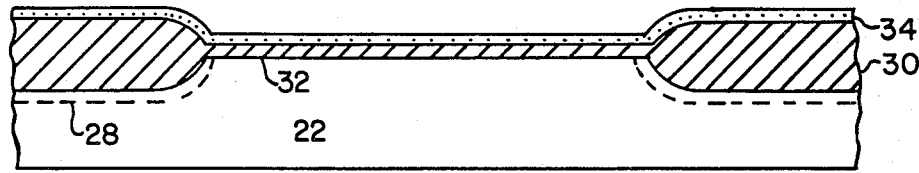
FIG. 6a,b

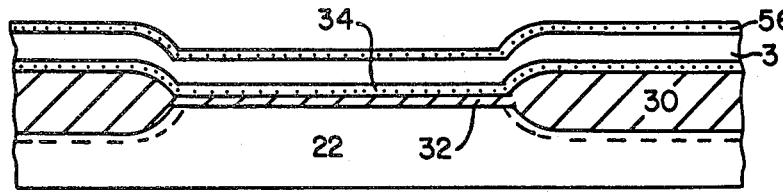
FIG.7b,c
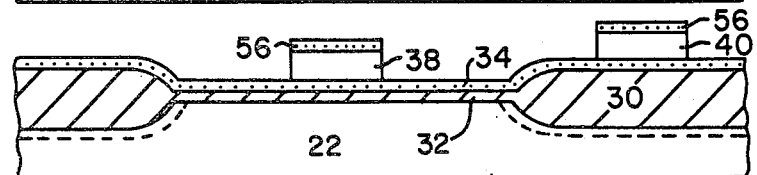
FIG.8b
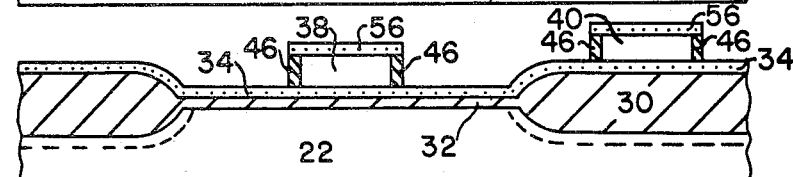
FIG.9b
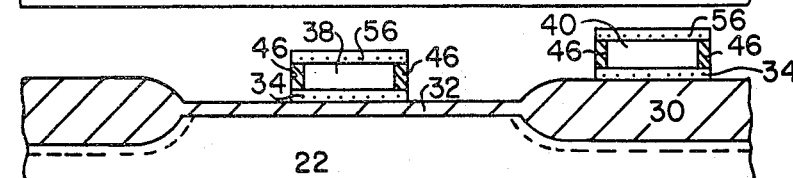
FIG.10b
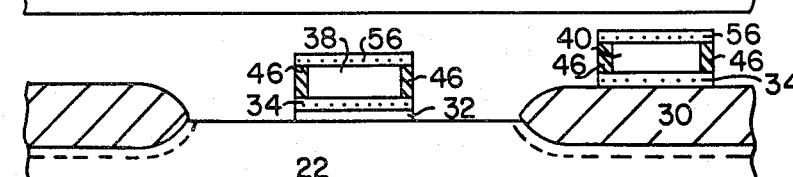
FIG.11b
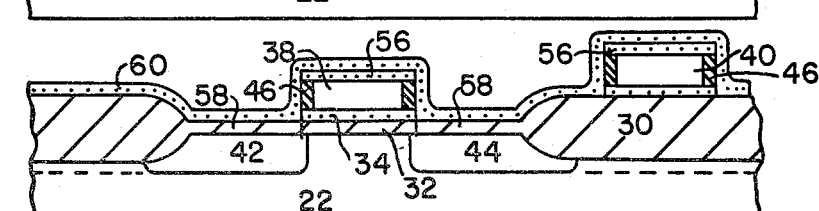
FIG.12b
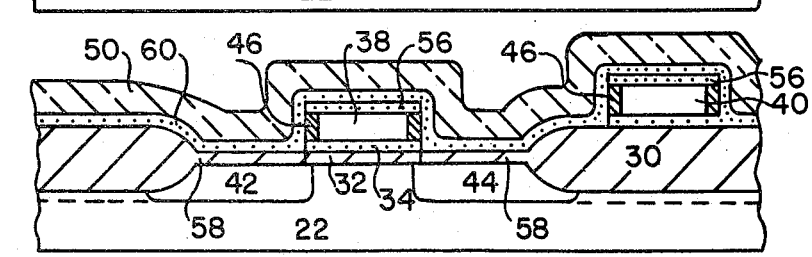
FIG.13b

METHOD FOR FABRICATING MOS DEVICE WITH SELF-ALIGNED CONTACTS

This a continuation-in-part of U.S. patent application Ser. No. 001,840 filed Jan. 8, 1979, abandoned and assigned to American Microsystems, Inc., the assignee of this application.

BACKGROUND OF THE INVENTION

1. Field of the Invention

The present invention relates to semiconductors and more particularly to a method for fabricating integrated circuits with self-aligned contacts.

2. Description of the Prior Art

Large-scale MOS integrated circuits, often having thousands of MOSFETs on a single semiconductor chip, must have a plurality of electrically conductive contacts through insulation overlying the surface of the semiconductor material to the active and passive regions in this material to provide the necessary interconnection between circuit lines, source-drain regions and gate electrodes of individual transistor elements. Using prior art techniques, it is necessary to make oversized conductive areas in the semiconductor material and rather large contact openings through the insulation overlying these conductive areas in order to accommodate mask alignment tolerances. This results in low density devices requiring a relatively large chip area.

With the rapid increase in the number of MOSFET elements in large-scale integrated circuit devices, efforts have been made to reduce not only the size of each element but also the size of the required contacts.

One method of increasing the density of semiconductor devices and reducing the problem of mask alignment is to form "self aligned" contact openings utilizing oversized contact masks. In general, self-aligned contacts are formed by utilizing an oversized contact mask, thus eliminating the difficulties of mask alignment. The contact is formed within the contact opening of the contact mask such that the contact is completely contained within the region to be contacted, thus eliminating short circuits to adjacent areas. In other words, the contact is self aligned because even though the oversized contact mask may expose regions surrounding the region to be contacted, the contact formed is completely within the region to be contacted. In the prior art, the perimeter of the contact opening is bounded on at least one side (and often three sides) by field oxide, even though the oversized contact mask exposes a portion of the field oxide adjacent to the contact. Such a device is described, for example, in U.S. Pat. No. 3,648,125 at column 9, lines 59–66, and also in U.S. Pat. Nos. 3,913,211 and 3,936,858. However, in such prior art devices, the self alignment feature is only available with regard to contact edges bounded by field oxide. Contact edges adjacent to gate regions or interconnects may not be formed in a self aligned fashion in accordance with these prior art methods.

A second attempt to solve part of this problem described in J. Electrochem. Soc. Solid State Science and Technology, Vol. 125, No. 3, March 1978, pp. 471–472, is to provide a gate material of polycrystalline silicon which is coated on its sides and top with a thin silicon dioxide ($SiO_2$) layer which serves as an electrical insulation between the polycrystalline silicon gate and metallization interconnects formed above the gate regions. However, this proved to be unsatisfactory because it failed to eliminate short circuits due to breakdowns or fractures of the $SiO_2$ layer created during subsequent processing. The use of a thin oxide layer on the top and sides of the gate electrode is also disclosed in U.S. Pat. Nos. 4,103,415 and 4,169,270.

SUMMARY

The present invention overcomes the problems mentioned above as well as other problems and provides several other advantages in addition to providing a means for making a high density large-scale integrated circuit device with a substantially smaller area per MOS transistor element than was heretofore possible. Moreover, the invention makes possible the production of such high density devices wherein the source-drain regions of the MOSFET elements can be formed either by diffusion or ion implantation techniques.

In accordance with the principles of the present invention MOSFET elements with self-aligned contacts forming an integrated circuit device are fabricated in a semi-conductor substrate by a method wherein an internal protective layer is formed covering the oxide insulation layer covering the gate material. This protective layer protects the gate insulation layer from etching during subsequent process steps, thus assuring the integrity of the gate insulation layer and thereby preventing shorts between the gate and conductive interconnects.

Unlike prior art devices utilizing self-aligned contacts, the source and drain contacts formed in accordance with this invention are self aligned on all sides even though the oversized contact mask may expose field oxide, gate electrodes, and interconnects. By self-aligning the source and drain contacts on all four sides, the sources and drains can be made smaller and placed directly adjacent to the gate electrodes, thereby materially reducing the size of each transistor and materially increasing the packing density of the resulting integrated circuit Preliminary steps of the method utilize conventional fabrication techniques. After the field oxide areas are formed with active area openings for transistor elements, polysilicon gate areas are formed within the openings. Polysilcon conductive interconnect lines are also simultaneously and selectively formed on the field oxide close or adjacent to such active area openings. In one embodiment of the present invention, all of these polysilicon gates and conductive lines are protected with a first layer of silicon nitride formed on their top surfaces and thereafter an oxide layer on their sides. Source-drain regions then are formed by diffusion techniques and thereafter a thin protective layer of silicon nitride is provided over the entire chip, covering the field oxide areas, the polysilicon areas and the active areas surrounding the polysilicon gate areas. A standard layer of phosphorus impregnated glass (PVX) is next applied to the entire chip covering the thin nitride layer, and thereafter a contact mask on the PVX layer is used to form the necessary source-drain contact openings by first etching away the PVX in the contact opening regions but stopping at the protective nitride layer. The thick field oxide and the thin oxide layer on the sides of the poly gate areas are prevented from being attacked during this long PVX etch by the thin nitride protective layer. This is of critical importance because the etching of the thick PVX layer takes a considerable amount of time. In prior art devices which do not use the protective nitride layer the oxide on the polysilicon material is damaged during such lengthy etches. Following this, the thin protective nitride layer in the contact areas is etched away by an etchant that will not attack the field oxide and the protective poly oxide. The thin layer of gate oxide exposed by the contact opening is then removed.

Of critical importance, the protective oxide layer on the sides of the polysilicon gate is considerably thicker than the thin layer of gate oxide; because of this the removal of the thin gate oxide does not destroy the integrity of the oxide layer protecting the side of the polysilicon gate. Thus, shorts between the to-be-formed conductive contact and the polysilicon gate are prevented. Thereafter, a polysilicon interconnect contact mask is used to form contact openings in the PVX layer and the top nitride layer on the polysilicon interconnect lines. Of importance, the protective nitride layer prevents damage to the gate oxide layer, thus preventing a short between the to-be-formed metallization contacting the polysilicon interconnect line, and the source-drain region located beneath the gate oxide layer.

Both the mask used to form the source-drain contact openings and the mask used to form the polysilicon interconnect contact openings utilize relatively large openings to assure registration or self-alignment with the desired contact areas. The previously applied thin nitride layer provides protection for the field oxide, the gate oxide, and the protective polysilicon oxide on the sides of the gate areas during the formation of the contact openings and assures against circuit shorts between metallization contacts, gates, polysilicon lines and source-drain regions. With the added internal protection of the thin nitride layer, the masking tolerances required to properly align polysilicon gates, polysilicon lines and contact openings are substantially less stringent than in the prior art, yet without requiring unusually close tolerances in placing the contact masks for forming the contact openings. The invention thus greatly reduces the problem of producing integrated circuit devices with more closely packed elements per unit area and yet a higher yield.

In an alternative form of this invention, the polysilicon (often called "poly" for short) gates and conductive lines, after being formed, are provided with a thin silicon dioxide layer on their sides and also on their top surfaces. The source-drain regions are then formed by ion implantation techniques with the polysilicon gate serving as a mask in a well-known manner. Thereafter, a thin internal protective nitride layer is applied over the entire chip surface. The protective nitride layer prevents internal shorts and any etching of the protective oxide layer on the conductive poly gates and the poly interconnect lines during the formation of oversized holes in the insulating PVX layer.

In summary, the objects of the invention are: to provide an improved method for forming semiconductor devices with contacts which are self-aligned on all sides; to provide a method that will allow a reduction in the spacing between contacts, gate, source-drain regions and conductive interconnect lines and thereby facilitate production of more closely packed devices; to provide a method that can be easily controlled with standard semiconductor production facilities; and to provide a method that will significantly increase the production yield on high density large-scale semiconductor devices with self-aligned contacts.

BRIEF DESCRIPTION OF THE DRAWING

FIG. 1 is a plan view of a typical MOS transistor structure with contacts formed as in the prior art;

FIG. 2 is a plan view of an MOS transistor structure formed with self-aligned contacts;

FIGS. 3a-18a illustrate the steps for forming self-aligned contacts for a semiconductor device according to the method of the present invention; and FIGS. 3b-19b illustrate the steps for forming self-aligned contacts for a semiconductor device using a modified method according to the present invention.

DETAILED DESCRIPTION

Figure 7A:
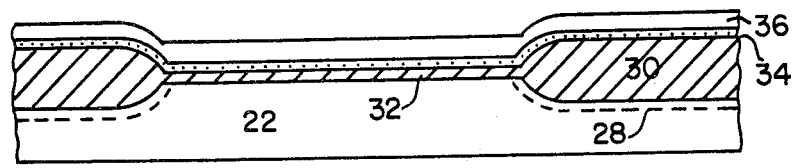

With reference to the drawing, FIG. 1 illustrates in plan view a prior art MOS transistor 10 having non-self-aligned source contact 12 and drain contact 14 and gate contact 16. Each source contact 12, drain contact 14, and gate contact 16 must cover a minimum area in order to provide a reliable low resistance connection. Because of alignment tolerances in forming such contacts using prior art fabrication techniques, it is necessary for the underlying source-drain region 18 to be considerably larger than the minimum contact area in order to assure proper registration of the contacts. For example, in order to produce a drain contact 14 having the minimum required contact area, a uniform tolerance around all sides of the contacts (shown at $L_1$ and $L_2$) is required when using prior art fabrication technology. Similarly, in order to prevent electrical shorts between drain contact 14 and gate electrode 10, a predetermined minimum spacing between contact edge and poly silicon edge ($L_3$) is required when using prior art fabrication technology. These prior art tolerance requirements result in a rather large MOS semiconductor device as shown in FIG. 1. The construction of an integrated circuit containing many such prior art devices results in a large, low density integrated circuit.

The reduction in chip area that can be achieved for a single MOS transistor 10a constructed with self-aligned contacts in accordance with this invention is illustrated in FIG. 2. Contact mask 17a is formed on the wafer as shown. Of importance, the source contact 12a and the drain contact 14a, both having the minimum required area for providing a reliable low resistance connection, are automatically registered with the border of the source-drain region 18a and the border of poly gate region 20a, as shown. Similarly, the gate contact 16a, also having the minimum required area, is automatically registered with the poly gate region 20a. The tolerances $L_1$, $L_2$ and $L_3$ are reduced to zero, and each source-drain region 18a and poly region 20 can have reduced dimensions in width and in length compared to the widths and lengths heretofor possible using prior art fabrication techniques. Also, because each contact is self-aligned (i.e., completely contained within the region to be contacted, even though the oversized contact mask exposes areas surrounding the region to be contacted), the spacing between contacts and the spacing between a contact and an adjacent conductive area can be reduced from the spacing required in prior art devices, thereby further decreasing the overall chip area required for a semiconductor device constructed in accordance with this invention.

The technique for making such a semiconductor device with self-aligned contacts according to one embodiment of the present invention, as well as the resulting structure, will now be described relative to FIGS. 3a-18a.

As shown in FIG. 3a, a semiconductor substrate 22, such as a wafer of P conductivity type silicon material having <100> crystal orientation and a resistivity of approximately 25-50 ohm-cm serves as the starting material. Other suitable substrates may be used. Substrate 22 is covered in a well-known manner with an initial oxidation layer 24 of 500-1000 Å. For example, oxide layer 24 may be formed on substrate 22 by thermal oxidation in a dry oxygen atmosphere for approximately 10-15 minutes at approximately 1050°. In a well-known manner, a second layer 26 of silicon nitride of approximately equal thickness is formed on oxide layer 24. Silicon nitride layer 26 is formed by conventional low pressure chemical vapor deposition techniques well known in the semiconductor industry.

Using a field oxide mask (not shown), the layers 24 and 26 are patterned (FIG. 4a) by first removing nitride 26 from the field areas using well-known techniques (e.g., selectively etching with phosphoric acid). Oxide 24 is then removed from the field areas using well-known methods such as etching with buffered hydrofluoric acid. The exposed field areas are then doped with a suitable dopant such as Boron (as indicated by the dotted lines 28) to a doping level suitable for adjusting the desired field threshold levels. The field may be doped by either well-known diffusion or ion implant techniques. For a typical field threshold level of 12 volts, a doping level of approximately $5.3 \times 10^{12}$ ions/cm$^2$ is used.

As shown in FIG. 5a, a relatively thick (approximately 8000-10,000 Å) field oxide 30 is now grown in the field areas by thermal oxidation in steam at approximately 1000° C. for approximately 90 minutes. This field oxide growth drives the field dopants 28 further into the substrate 22 under the field oxide 30. In a typical semiconductor structure, the field oxide 30 is configured as shown in FIG. 5a to form holes or openings defining the active areas 99 within which MOS transistors are to be formed. The formation of a typical field oxide of this type is described, for example, in U.S. Pat. No. 3,936,858.

After field oxide 30 is formed, the original nitride layer 26 and the original gate oxide layer 24 are removed (not shown) by suitable etchants, as previously described. Thereafter, the wafer is oxidized in a dry oxygen atmosphere at approximately 1050° C. for approximately twenty (20) minutes forming a new gate oxide layer 32 of approximately 500 Å thickness within the active area. The thickness of field oxide 30 is also increased a slight amount during this oxidation. This increase in the field oxide thickness is unimportant.

As shown in FIG. 6a, over the entire device surface, including the gate oxide layer 32 and the field oxide 30 (as shown in FIG. 6a), a thin (e.g. 150-300 Å) silicon nitride layer 34 is formed using, for example, conventional low pressure vapor deposition techniques. In order to ensure stability of the device (i.e. to minimize charge trapping within the nitride layer) and to allow subsequent layers of photoresist to adhere more readily to the wafer, the upper surface of nitride layer 34 is oxidized in a dry oxygen atmosphere at approximately 950° C. for approximately 3-4 hours thus forming a thin (approximately 50-100 Å) layer of oxide on the surface of nitride layer 34. This thin layer of oxide is also used during the formation of contact openings to conductive polysilicon lines, as is more fully explained later. For clarity, this thin oxide layer is not shown in the Figures. Thus, FIG. 6a shows a new gate oxide 32 and nitride layer 34 of desired thicknesses. However, it is to be understood that the original gate oxide and nitride layers 26 of appropriate thicknesses shown in FIG. 3a, could be used as the gate dielectric.

In the next step of this embodiment of the invention, as shown in FIG. 7a, a layer 36 of polycrystalline silicon (poly) is formed to a thickness of approximately 3000-5000 Å over the entire surface of the wafer. The poly layer 36 may be formed, for example, by the standard vapor deposition process well known in the semiconductor industry. Poly layer 36 is then doped with a suitable dopant (e.g. phosphorus) to increase its conductivity to approximately 20-30 ohms/square.

Figure 8A:
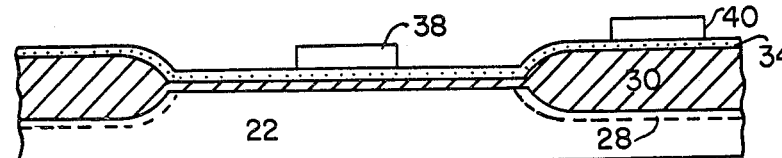
Figure 9A:
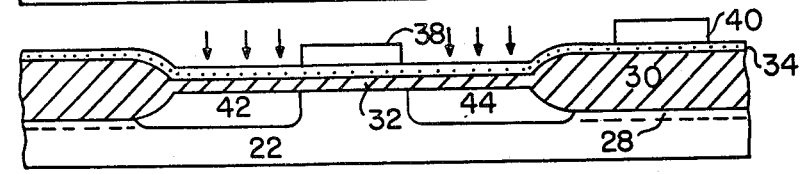

Well-known masking and etching techniques are then used to remove undesired portions of poly 36 and thus define (as shown in FIG. 8a) gate electrodes 38 within the active areas and interconnect lines 40 situated on top of the field oxide 30 and adjacent to one or more gate electrodes 38. Poly 36 is etched, for example, with a CF$_4$ plasma. At this time, all portions of poly gate 38 within the active area and on the field oxide are situated on nitride layer 34. Using well-known ion implantation techniques wherein the gate 38 serve as a mask, dopant ions are implanted in substrate 22, as represented by the vertical arrows in FIG. 9a, to form source region 42 and drain region 44 within substrate 22 just below the gate oxide 32 on opposite sides of polysilicon gate 38.

Figure 10A:
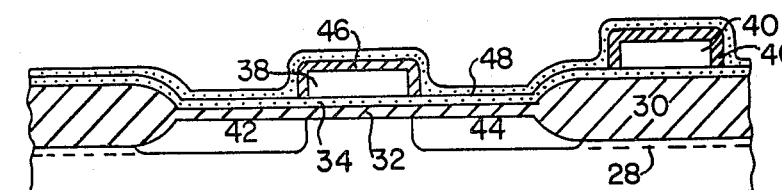

In the next step, as shown in FIG. 10a, poly gates 38 and poly interconnect lines 40 are oxidized with all other portions of the wafer protected from oxidation by nitride layer 34. A layer 46 of silicon dioxide is thus grown on all sides and also on the top of all conductive poly areas including the gate poly areas 38 and the adjacent poly interconnect lines 40. The thickness of this oxide layer 46 is approximately 3000 Å and is considerably greater than the 500 Å thickness of gate oxide 32. Oxide layers 46 protect the poly gate 38 and poly interconnect line 40 during subsequent processing. Oxide 46 is formed by thermal oxidation in steam at approximately 950° C. for approximately 60-90 minutes. Simultaneously, a thin oxide layer (not shown) is also formed on nitride layer 34, to a thickness of approximately 50-100 Å. This thin oxide layer serves a useful purpose during the formation of interconnect contacts as will be more fully explained later.

In the next step, also shown in FIG. 10a, a thin protective nitride layer 48 is formed to a thickness of approximately 100-300 Å using the low pressure chemical vapor deposition techniques previously described. Nitride layer 48 covers the entire structure, including the field oxide 30, the source region 42, drain region 44, the poly gate 38 and poly interconnect line 40. Nitride layer 48 will later serve to provide vital protection for field oxide 30 and protective poly oxide 46 during subsequent process steps.

Figure 11A:
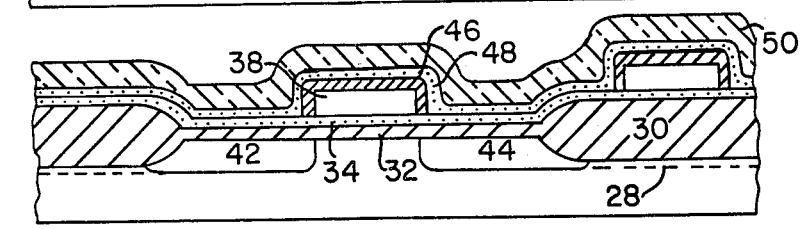

Following the formation of nitride layer 48, the entire wafer, as shown in FIG. 11a, is covered with a relatively thick (approximately 10,000 Å) layer of phosphosilicate glass (PVX) 50 using well-known techniques. PVX 50 serves to electrically insulate underlying areas from to-be-formed metallization. PVX 50 is formed by conventional vapor deposition techniques that are well-known in the semiconductor industry.

Figure 12A:
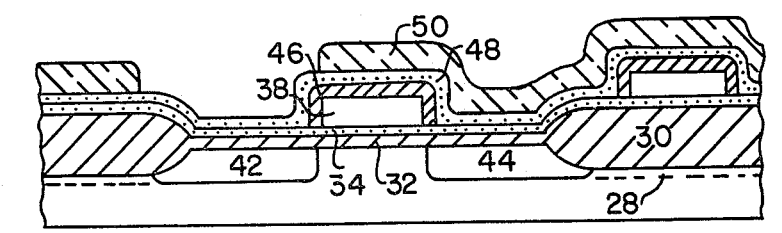
Figure 13A:
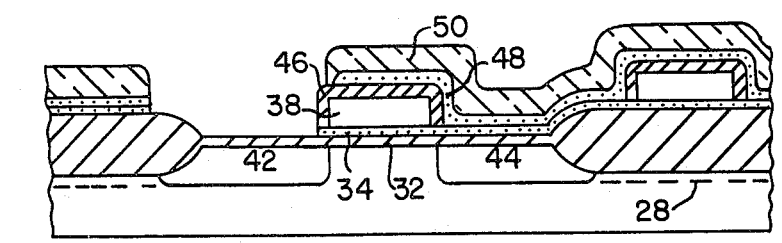

A first contact mask (not shown) for the source-drain contacts is applied to the PVX layer 50 and a suitable etchant (e.g. buffered hydrofluoric acid) is used to remove the PVX layer 50 in the source-drain contact areas, as shown in FIG. 12a. The buffered hydrofluoric acid used to etch PVX 50 does not affect nitride layers 34 and 48, and thus oxide layers 32 and 46 and the thin oxide layer (not shown) formed on nitride layer 34 are protected during the relatively long (i.e. approximately 3 minutes) etch of PVX layer 50. Prior art methods did not protect oxide layers 32 and 46 during this etch, thus possibly allowing damage to oxide layers 32 and 46. A suitable etchant (e.g., CF$_4$ plasma) is then used to etch the nitride layers 34 and 48 in the source-drain contact opening, as shown in FIG. 13a. Of importance, the use of a CF$_4$ plasma as the nitride etchant does not significantly attack PVX 50, field oxide 30, or protective oxide 46 because they are relatively thick. The plasma etchant also removes within the contact opening the thin oxide layer (not shown) formed on nitride layer 34, while not damaging the gate oxide 32, because gate oxide 32 is protected by nitride 34 during the etching, except for a very brief period after the nitride 34 is removed.

Figure 14A:
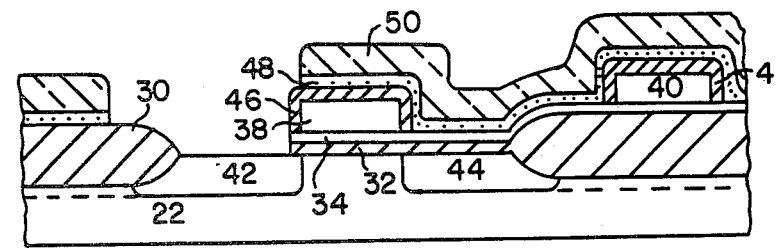
Figure 15A:
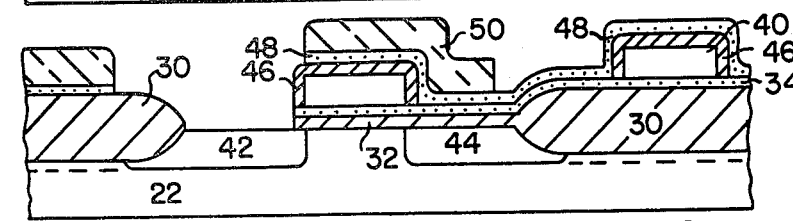
Figure 16A:
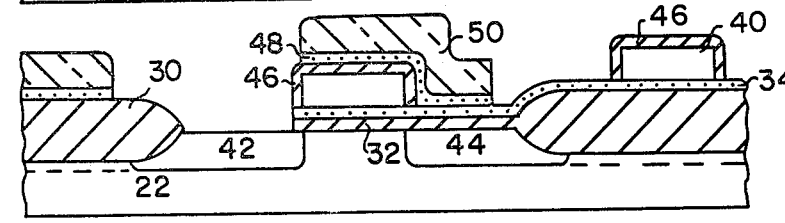

Gate oxide 32 is then removed from the contact area such as by etching for approximately 1 minute with buffered hydrofluoric acid, as shown in FIG. 14a. Of importance, oxide layer 46 protecting poly gate 38 is significantly thicker than the gate oxide 32 being removed, thus preventing damage to protective oxide 46 during removal of gate oxide 32. With protective oxide 46 intact, source-drain contact metallization is later deposited without electrically shorting to poly gate 38. Without the use of protective nitride layer 48, protective oxide 46 would be damaged during the time consuming etching of the PVX layer 50, thus possibly allowing the formation of electrical shorts between to-be-formed source contact metallization and gate 38.

Figure 17A:
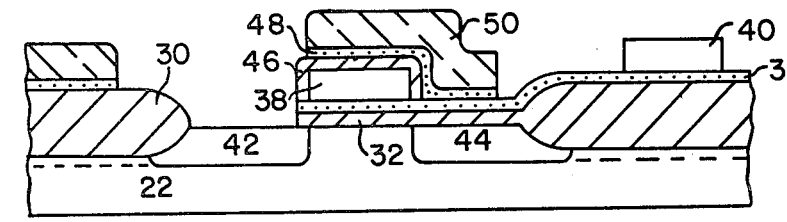

A second contact mask (not shown) is now applied to the wafer in the same manner as the first contact mask to form contact openings for electrical connection to poly interconnect lines 40. This second contact mask simultaneously covers and protects the layers exposed by the previously formed source-drain contact opening. PVX layer 50 is removed (FIG. 15a) from the interconnect contact openings using a suitable etchant, such as buffered hydrofluoric acid. Nitride layers 34 and 48 protect gate oxide 32, field oxide 30, and interconnect protective oxide 46 during the relatively long (e.g. 3 minutes) etching of PVX layer 50. Nitride layer 48 is then removed (FIG. 16a) using a suitable etchant, for example, phosphoric acid. The use of phosphoric acid, rather than the CF$_4$ plasma used in conjunction with the first contact mask as previously described, allows nitride layer 48 to be etched while preventing etching of the thin oxide layer (not shown) formed on nitride layer 34. The thin oxide layer (not shown) formed on nitride layer 34 serves to prevent etching of nitride layer 34 during the removal of nitride layer 48, such that nitride layer 48 is removed, thus exposing protective oxide 46, while leaving intact nitride layer 34. Protective oxide 46 is then removed from poly line 40 (FIG. 17a), for example, using buffered hydrofluoric acid, thus exposing poly interconnect line 40. At the same time, the thin oxide layer (not shown) previously formed on poly layer 34 is removed. Of importance, nitride layer 34 prevents damage to gate oxide 32 and field oxide 30 during the removal of protective oxide 46, thus preventing electrical shorts between the to-be-formed metal interconnects and source-drain region 44. This leaves the device, as shown in FIG. 17a, with poly gate 38 protected by PVX layer 50, nitride layer 48, and protective oxide 46. Contact openings expose the source area 42 and poly interconnect line 40. Of course, the poly interconnect contact opening may be formed prior to the formation of the source-drain contact openings, if desired.

Figure 18A:
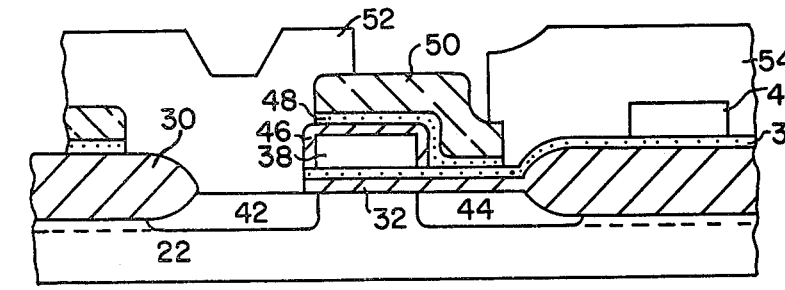

Standard fabrication techniques are now used to deposit a conductive material such as metal in the contact areas to form, as shown in FIG. 18a, contacts 52 and 54 as part of a desired interconnect pattern (typically metal) on the semiconductor device. Generally, metallization is formed on the semiconductor device by evaporating metal (typically aluminum) on the surface of the device and patterning this metal with appropriate masking and etching techniques. Suitable etchants for the patterning of metal include a well-known metal etch solution comprised of acetic, nitric and phosphoric acids.

In a second embodiment of the present invention, illustrated by FIGS. 3b–18b, the initial steps of FIGS. 3b–6b inclusive are identical to those of FIGS. 3a–6a. However, this second embodiment utilizes well-known diffusion techniques for forming the source and drain regions. The various layers are formed and removed using the process previously described in regard to the first embodiment and thus the description of these steps will not be repeated.

As shown in FIG. 7b field oxide 30 and gate oxide 32 are formed on a substrate 22. Poly layer 36 having a typical thickness in the range of 3000–5000 Å is formed on the wafer over the nitride layer 34, for example, by well-known conventional low pressure chemical vapor deposition. Poly layer 36 is then doped as previously described to increase its conductivity. Thereafter, a nitride layer 56 having a thickness of approximately 1000–2000 Å, and thus considerably thicker than the gate nitride layer 34, is formed as previously described on the polysilicon layer 36.

As shown in FIG. 8b, the polysilicon layer 36 is patterned in a two step process into gate areas and interconnect lines by using a poly mask (not shown) and well-known etching techniques which first remove the unwanted portions of nitride layer 56, for example, by etching with phosphoric acid. The unwanted portions of poly layer 36 are then removed, for example, by etching with a CF$_4$ plasma. This leaves the structure shown in FIG. 8b having a doped polysilicon gate 38 within an active area surrounded by field oxide 30, and an adjacent poly interconnect line 40 situated on the field oxide 30. Both poly gate 38 and poly interconnect line 40 have the nitride layer 56 remaining on their top surfaces.

In the next step, shown in FIG. 9b, the poly gate element 38 and the poly interconnect line 40 are oxidized thus forming an oxide layer 46 on their sides having a thickness of approximately 3000 Å. This oxidation is accomplished, for example, by simple thermal oxidation in a chamber in accordance with well-known techniques.

Now, the source region 42 and drain region 44 are formed by diffusion techniques. First, using suitable well-known masking and etching techniques, the gate nitride layer 34 is etched away from every surface except the top and bottom of poly gate 38 and poly interconnect line 40, as shown in FIG. 10b. Then, as shown in FIG. 11b, the gate oxide layer 32 is removed in all the areas surrounding the poly gate 38. Well-known diffusion techniques are now used to form the source region 42 and drain region 44. Following this diffusion, a new thin gate oxide layer 58 is formed, as shown in FIG. 12b, over the diffused source region 42 and drain region 44, to a thickness of approximately 500 Å.

A thin protective nitride layer 60 (e.g., 150–300 Å) is applied to the structure, as shown in FIG. 12b. Nitride layer 60 is thus much thinner than the nitride layer 56 and, as with the previous embodiment, layer 60 extends over the entire surface of the chip including the field oxide 30, source region 42, drain region 44, and the nitride covered poly gate 38 and poly interconnect line 40.

Figure 14B:
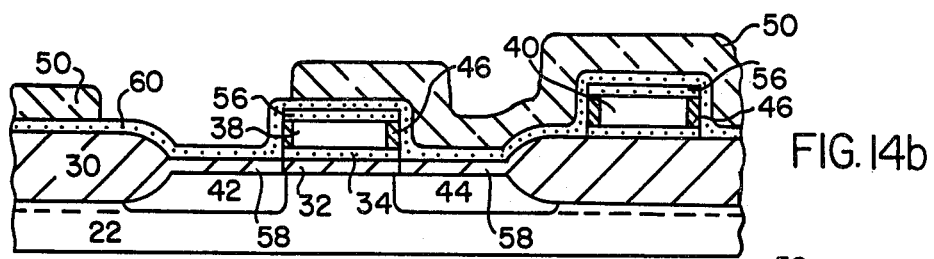
Figure 15B:
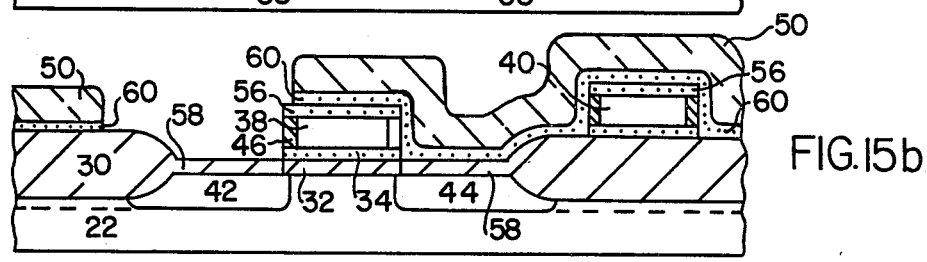
Figure 16B:
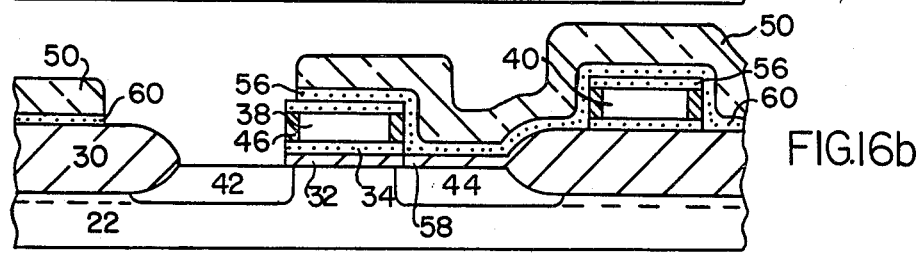

Now, PVX layer 50 of approximately 10,000 Å is applied (FIG. 13b) using well-known techniques. Using contact masks in the same manner as previously described with respect to the first embodiment of this invention, portions of PVX layer 50 are removed, as shown in FIG. 14b, to form the source-drain contacts. Nitride layer 60 is then removed in the contact area (FIG. 15b) in the same manner as in the previously described first embodiment, without the etchant used to remove the nitride affecting field oxide 30, PVX 50, gate oxide 58 and protective oxide 46. Gate oxide layer 58 is then removed (FIG. 16b) from the contact area in the same manner as used in the previously described first embodiment. Of importance, gate oxide 58 is significantly thinner than oxide layer 46 protecting poly region 38. Thus, protective oxide layer 46 is not damaged during the removal of the gate oxide 58.

Figure 17B:
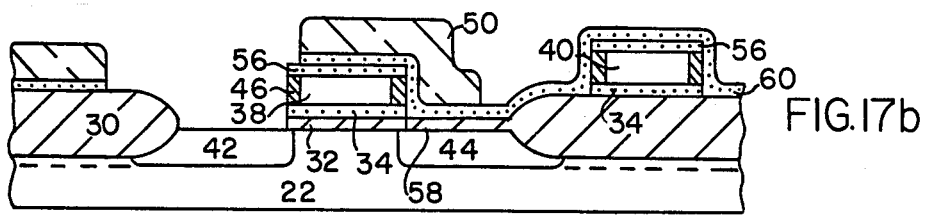
Figure 18B:
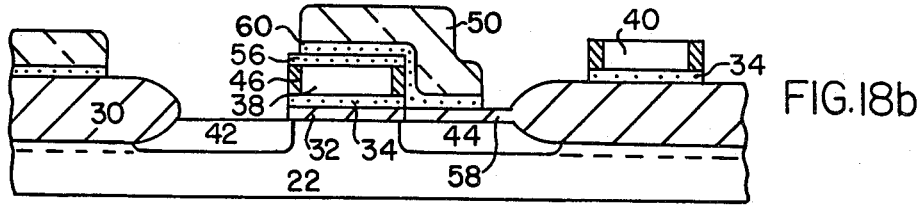

A second contact mask (not shown) is applied to the surface of the device for the purpose of providing contact openings to selected portions of poly interconnect line 40 and protecting the layers exposed by the source-drain contact opening. First, PVX 50 is removed from the poly interconnect line contact area, as shown in FIG. 17b. Nitride layers 34 and 56 are then removed from the poly interconnect line contact area, as shown in FIG. 18b. Of importance, the portion of gate oxide 58 located within the poly interconnect line contact opening is not damaged during the removal of protective nitride layer 34 because the etchant used to remove the nitride does not attack oxide.

Figure 19B:
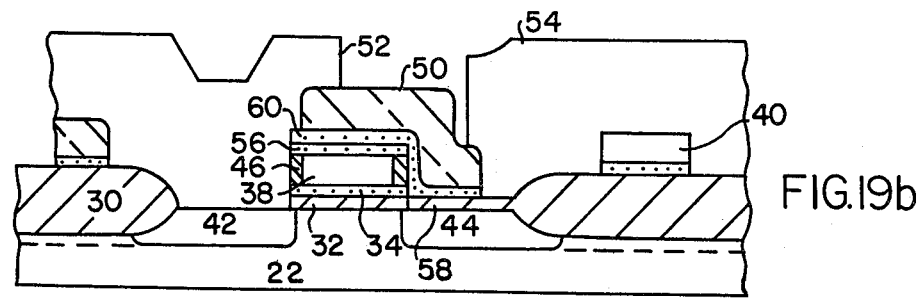

With contact openings thus formed, the metal contacts 52 and 54 are formed in a well-known manner, as shown in FIG. 19b. Because oxide 46 protecting poly gate 38 is not damaged during the formation of the contact, shorts between metallization 52 and poly 38 are prevented. Similarly, because gate oxide 58 over drain 44 is not damaged during the formation of the poly interconnect line contact, shorts between metallization 54 and drain 44 are prevented.

By utilization of either embodiment of the method according to the invention, it is possible to produce large-scale semiconductor devices with a multiplicity of MOSFET elements having self-aligned contacts and therefore requiring a minimum of chip area in a closely-packed array. For example, in a typical random access memory (RAM) the area required for a single memory cell was 1344 square microns, whereas, with the self-aligned contacts made possible using the present method, the same memory cell has an area of only 950 square microns, a reduction in area of approximately 30%. Yet, with the method of the present invention, the yield of such closely-packed devices with self-aligned contacts can be even higher than with prior art devices because the internal protective nitride layers 48 (FIGS. 10a–18a) and 60 (FIGS. 12b–19b) maintain circuit integrity during critical process steps by preventing shorts or failures heretofore caused during the various process steps.

While silicon nitride is a preferred material for the protective layers, other materials could be used such as silicon carbide or aluminum oxide.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A method for fabricating an integrated circuit semiconductor device having a plurality of field effect transistor (FET) elements with self-registering electrical contacts on their source and drain regions and their gate electrodes connected to the device interconnection lines, said method comprising the steps of:

forming a patterned layer of field oxide on a semiconductive substrate of a first conductivity type in order to form active areas free from said field oxide on the substrate surface for the formation of said FET elements;

forming a relatively thin gate dielectric layer within said active areas;

forming a layer of conductive material over the surface of the substrate;

patterning said layer of conductive material into conductive gate electrodes of a predetermined shape and thickness, over said gate dielectric layer within said open areas;

forming a first layer of dielectric material on the sides and top of each said conductive gate electrodes;

forming, within each said active area surrounded by said field oxide, doped silicon source and drain regions of a second conductivity type material opposite to said first conductivity type of said substrate, the boundaries of said source and drain regions being determined by the edge of said field oxide and by the edges of said gate electrodes whereby said source and drain regions are self-aligned with respect to the edges of said gate electrode;

forming a relatively thin layer of protective material over the entire device including all areas of conductive material in said active areas and said field oxide areas;

covering said thin layer of protective material on said device with a relatively thick layer of insulating material;

forming oversized contact openings through said insulating material over said gate electrode and over said source and drain regions where electrical contacts are to be formed;

removing said second layer of dielectric material within said oversized contact openings;

removing said gate oxide from the surfaces of said source and drain regions with said oversized contact openings; and depositing a metallic-type, high-electrical conductivity interconnection line pattern on the surface of the wafer extending into said contact openings thereby forming electrical connections with said source and drain regions within said contact openings.

2. The method as described in claim 1 wherein said layer of protective material is silicon nitride formed to a thickness in the range of 100 Å to 300 Å.

3. The method as described in claim 2 wherein the upper surface of said silicon nitride protective layer is oxidized before application of said insulating material.

4. The method as described in claim 1 wherein said protective layer is silicon carbide.

5. The method as described in claim 1 wherein said protective layer is aluminum oxide.

6. The method as described in claim 1 wherein said gate dielectric layer is a sandwich of silicon nitride over silicon dioxide.

7. The method as described in claim 1 wherein said conductive gate electrodes are polycrystalline silicon and said first layer of dielectric material on the sides and top of each said conductive gate electrodes is silicon dioxide.

8. The method as described in claim 7 wherein said source and drain regions are formed by ion implantation.

9. The method as described in claim 1 wherein said first layer of silicon dioxide on said gate electrodes has a thickness of around 3000 Å to 5000 Å.

10. The method as described in claim 1 wherein said conductive gate electrodes are polycrystalline silicon whose sides are covered with a layer of silicon dioxide and whose top is covered with a layer of silicon nitride.

11. The method as described in claim 10 wherein the thickness of the silicon dioxide layer on the sides of said gate electrode is around 3000 Å to 5000 Å and wherein the thickness of said silicon nitride layer on the top thereof is around 1000 Å to 2000 Å.

12. The method as described in claim 10 wherein said source and drain regions for each said FET are formed by a diffusion process.

* * * * *

UNITED STATES PATENT AND TRADEMARK OFFICE
CERTIFICATE OF CORRECTION

PATENT NO. : 4,466,172
DATED : August 21, 1984
INVENTOR(S) : Tarsaim L. Batra

It is certified that error appears in the above-identified patent and that said Letters Patent is hereby corrected as shown below:

Column 2, line 39, delete the period following "conventional".

Column 5, line 56, insert a space between "$\overset{o}{A}$)" and "silicon".

Signed and Sealed this

Twenty-sixth Day of March 1985

[SEAL]

Attest:

DONALD J. QUIGG

Attesting Officer     Acting Commissioner of Patents and Trademarks